(12) United States Patent
Kawagishi et al.

(10) Patent No.: US 7,885,081 B2
(45) Date of Patent: Feb. 8, 2011

(54) COMPONENT INCORPORATING MODULE

(75) Inventors: Makoto Kawagishi, Komatsu (JP); Tsutomu Ieki, Moriyama (JP); Tadashi Kani, Kyoto (JP); Satoru Noda, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/041,730

(22) Filed: Mar. 4, 2008

(65) Prior Publication Data

US 2008/0149381 A1 Jun. 26, 2008

Related U.S. Application Data

(63) Continuation of application No. PCT/JP2006/315389, filed on Aug. 3, 2006.

(30) Foreign Application Priority Data

Sep. 20, 2005 (JP) ............................ 2005-271275

(51) Int. Cl.
*H05K 1/18* (2006.01)

(52) U.S. Cl. .................. 361/761; 361/763; 361/764; 361/782

(58) Field of Classification Search ......... 361/760–765, 361/782–785, 792–795

See application file for complete search history.

(56) References Cited

U.S. PATENT DOCUMENTS 5,027,253 A * 6/1991 Lauffer et al. ............. 361/321.4
6,002,592 A * 12/1999 Nakamura et al. .......... 361/760
6,038,133 A 3/2000 Nakatani et al.
6,338,767 B1 1/2002 Nakatani et al.
6,489,685 B2 * 12/2002 Asahi et al. ................. 257/774
6,625,037 B2 9/2003 Nakatani et al.
7,068,519 B2 6/2006 Nakatani et al.
7,315,455 B2 * 1/2008 Furukawa et al. .......... 361/760
2003/0087538 A1 5/2003 Ueno
2004/0160752 A1 8/2004 Yamashita et al.
2005/0045369 A1 3/2005 Ishimaru et al.

FOREIGN PATENT DOCUMENTS

JP 2002-076637 A 3/2002
JP 2002-223076 A 8/2002
JP 2005-039158 A 2/2005
JP 2006-303202 A 11/2006

OTHER PUBLICATIONS

Official communication issued in the International Application No. PCT/JP2006/315389, mailed on Aug. 29, 2006.
Official Communication issued in corresponding Japanese Patent Application No. 2007-536418, mailed on Sep. 7, 2010.

* cited by examiner

*Primary Examiner*—Tuan T Dinh
(74) *Attorney, Agent, or Firm*—Keating & Bennett, LLP

(57) ABSTRACT

A component incorporating module includes an insulation resin layer, a plurality of lands arranged to mount components and wiring patterns connected to the plurality of lands, which are arranged along a first main surface of the resin layer, and circuit components connected to the lands to mount components. The circuit components are embedded in the resin layer. The plurality of lands have thicknesses that are greater than those of the wiring patterns adjacent to the corresponding lands.

4 Claims, 6 Drawing Sheets

COMPONENT INCORPORATING MODULE

BACKGROUND OF THE INVENTION

1. Field of the Invention

The present invention relates to a method for manufacturing a component incorporating module having a resin layer incorporating a circuit component and the component incorporating module.

2. Description of the Related Art

In response to the recent increase in capacity and miniaturization of electronic apparatuses, there are increased demands for further miniaturization and increased densification of electronic components provided in circuit boards. Under these circumstances, a component incorporating module which obtained a high density by incorporating a plurality of circuit components in a resin layer has been proposed.

Japanese Unexamined Patent Application Publication No. 11-220262 discloses two typical methods for manufacturing a component incorporating module which are associated with the formation of circuit patterns connected to circuit components to be incorporated in an insulation substrate.

FIG. 2 of Japanese Unexamined Patent Application Publication No. 11-220262 illustrates a method for providing circuit components on a plain copper foil which has not been patterned, hardening the circuit components using a resin, and forming circuit patterns by etching the copper foil from a rear side thereof.

Furthermore, FIG. 3 of Japanese Unexamined Patent Application Publication No. 11-220262 illustrates a method for forming circuit patterns on a mold release film, providing circuit components on the circuit patterns, hardening the circuit components using resin, and removing the mold release film.

In the former method, since the circuit components are connected to a plain copper foil, portions corresponding to lands (foot patterns) for mounting the components and portions corresponding to lines cannot be distinguished from one another in the copper foil. Therefore, when the circuit components are connected to the copper foil by soldering, the components may be moved from predetermined locations or solder may protrude to the portions corresponding to the lands adjacent to the solder.

In the latter method, since the components are provided on the patterns formed on the mold release film, the components are prevented from being moved and solder is prevented from protruding as compared to the former method. However, since lands for mounting the components and portions corresponding to wiring are continuously arranged, the components may be moved by the wiring used to connect components to one another during reflow processing. Furthermore, when the circuit components are connected to the circuit patterns using solder bumps, the solder may protrude to wiring portions located between terminals. Therefore, heights of the bumps may not be uniform after the reflow processing and stresses may be unevenly applied to the terminals.

To address these problems, a method for forming a solder resist film on a cooper foil or circuit patterns has been proposed. However, in this method, an additional resist film is required and the depth and the height of a module cannot be sufficiently reduced. In addition, the number of processing steps is increased, which results in an increase in cost. Furthermore, when the solder resist film is formed on a component mounting surface and a resin layer is formed on the solder resist film, since the component mounting surface is not sufficiently attached to the resin layer, a gap is likely to be produced between the resin layer and the resist film or between the resist film and an electrode. The gap may cause solder flashing, because the solder which is remelted and swollen in the module due to the high temperatures generated when the module is connected to a circuit board (mother board, for example) by soldering protrudes into the gap. Furthermore, since displacements of the wiring and the resist must be taken into consideration, a problem arises in that the board is not designed to conform to small intervals between the terminals of the components.

The problems described above arise when the circuit components are connected to a plain electrode or circuit patterns by soldering. However, even when a conductive adhesive agent or metal bumps are used for the connection instead of soldering, the conductive adhesive agent may unnecessarily protrude or the circuit components may be displaced relative to the predetermined locations. Therefore, the locations of the circuit components are not fixed, which results in a deterioration in reliability.

SUMMARY OF THE INVENTION

To overcome the problems described above, preferred embodiments of the present invention provide a method for manufacturing a component incorporating module in which circuit components are stably provided in predetermined locations and which has high reliability, and also provide such a novel component incorporating module.

According to a preferred embodiment of the present invention, a method for manufacturing a component incorporating module includes a first step of forming a plurality of lands for mounting components independently on a transfer plate in an isolated manner, a second step of connecting circuit components to the lands for mounting components formed on the transfer plate, a third step of forming an insulation resin layer on the transfer plate so as to cover the circuit components, hardening the resin layer, and embedding the circuit components in the resin layer, a fourth step of removing the transfer plate from the resin layer, and a fifth step of forming, on a back surface of the resin layer in which the lands for mounting components are exposed, wiring patterns used to connect the lands for mounting components to one another and used to connect the lands for mounting components to other portions so that the wiring patterns overlap the lands for mounting components.

According to a preferred embodiment of the present invention, a component incorporating module includes an insulation resin layer, a plurality of lands for mounting components and wiring patterns connected to the plurality of lands for mounting components, which are arranged along a first main surface of the resin layer, and circuit components connected to the lands for mounting components. The circuit components are embedded in the resin layer. The lands for mounting components have thicknesses greater than those of the wiring patterns adjacent to the corresponding lands for mounting components.

According to the method for manufacturing a component incorporating module, the circuit components are connected to the plurality of lands for mounting components independently formed on the transfer plate in an isolated manner. That is, since the lands are not connected to one another using wiring, the solder does not protrude out from the lands at a time of mounting using solder, for example. Therefore, the components are prevented from being moved and the solder is prevented from protruding. Accordingly, a component incorporating module having high reliability is obtained.

Similarly, at a time of mounting using solder bumps, since the bumps which have been melted during reflow processing do not protrude to the wiring portions, and accordingly, do not cause deformation, deterioration of mounting reliability is prevented.

Since the components which contact each other due to the movement of the components described above and short circuits generated between terminals do not occur, the components can be mounted with relatively high density, and miniaturization and high functionality of the module are improved.

Furthermore, since a resist film is not required to be formed on a component-mounting surface, the depth and the height of the module can be reduced, and the number of processing steps and cost are reduced. Since the component-mounting surface and the resin layer are firmly attached to each other, solder flashing is prevented from being produced. Moreover, displacements of the wiring and the resist do not occur. Thus, intervals between lands may be reduced, components including terminals having narrow pitches may be provided, and chip components may be arranged closely to each other.

When the circuit components are mounted on the lands for mounting components, stresses in tension or distortion may be applied to the lands. As with the related art, when the lands for mounting components and the wiring patterns are continuously formed, cracks or distortions may be produced not only in the lands but also in the wiring patterns. However, since the wiring which connects the lands to one another is not arranged according to preferred embodiments of the present invention, even when the cracks are produced in the lands during the mounting of the circuit components, the wiring portions are not influenced by the cracks. Since the wiring patterns are arranged on the back surface of the lands for mounting components in an overlapping arrangement, even when the cracks are produced in the lands, the cracks are fixed by the wiring patterns resulting in improved reliability.

The circuit components may be attached to the lands for mounting components by soldering.

When the circuit components are attached to the lands by soldering, since solder is melted, the circuit components are easily moved. However, since the lands are formed in an isolated manner (that is, the lands are not continuous with the wiring portions), movement of the circuit components are restrained within the areas of the lands, that is, movements of the circuit components are confined, and the solder is prevented from protruding so that short circuits between the circuit components and other potential portions are prevented.

Preferably, the first step includes a step of forming via lands to be arranged separately from the lands for mounting components on the transfer plate, and a step of arranging conductive patterns which are conductively connected through the via lands and via holes on a surface of the resin layer after the third step.

When the wiring patterns are formed on the back surface of the resin layer defining a substrate, it may be necessary to form the conductive patterns on the surface of the resin layer and to connect the conductive patterns to the wiring patterns through the via holes. In this case, since the via lands are formed simultaneously with the lands for mounting components, the via holes and the via lands are conductively connected, which produces a component incorporating module having high reliability.

Preferably, the wiring patterns are formed so as to cover the lands for mounting components and so as to be larger than circumferences of the lands for mounting components.

When the circuit components are attached to the lands by soldering, the lands are surrounded by the solder from the sides thereof, and the solder may be exposed on the back surface of the resin layer. In this state, when the wiring patterns are formed by plating, the exposed solder is degraded by an etching solution used during etching processing, which results in a deterioration in the mounting reliability by soldering. To avoid this disadvantage, the wiring patterns are formed so as to cover the lands for mounting components and so as to be slightly larger than the circumferences of the lands for mounting components. Accordingly, since the solder exposed on the back surface of the resin layer is covered with the wiring patterns, the solder is prevented from being degraded by the etching solution. More preferably, the wiring patterns are formed so as to sufficiently cover the solder exposed on the back surface of the resin layer.

Since the wiring patterns are formed as described above, the following advantages are obtained.

Since the wiring patterns cover the solder, the solder is prevented from being exposed without using a solder resist. Accordingly, a problem does not arise in which a gap is produced between the solder resist and the resin layer due to heat expansion generated during mounting on a circuit board, and the solder is prevented from protruding into the gap.

Preferably, the method further includes a step of laminating at least an additional resin layer on the back surface of the resin layer in which the wiring patterns are formed, and a step of forming terminal electrodes electrically connected to the circuit components on the back surface of the laminated lowermost resin layer. These steps are performed after the fifth step.

When the component incorporating module is provided in the circuit board (mother board), the back surface of the resin layer in which the wiring patterns are formed may define a mounting surface. However, because the wiring patterns are exposed, the wiring patterns are likely to be short-circuited with portions having different potentials arranged on the circuit board. In this case, the wiring patterns may be covered with an insulation film, such as a resist film. However, since the mounting surface and the wiring patterns are arranged in close proximity to each other, the solder of the circuit components connected to the lands is likely to remelt at the high temperature generated at the time of mounting on the circuit board. Since an additional resin layer is laminated on the back surface of the resin layer and the terminal electrodes are formed on the back surface of the additional resin layer, the wiring patterns are insulated from other portions. In addition, the influence of heat generated at the time of mounting on the circuit board is reduced due to an adiabatic effect of the resin layer and the solder of the circuit components is prevented from remelting.

The additional resin layer laminated on the back surface of the resin layer in which the wiring patterns are formed may be defined by a single layer or two or more layers. The additional resin layer may include other circuit components or may include wiring patterns formed thereon. Preferably, the circuit components are not incorporated in the lowermost resin layer. The via holes are used as desired so that the wiring patterns and the terminal electrodes formed on the back surface of the lowermost resin layer are electrically connected to one another.

In this component incorporating module, the lands for mounting components are formed so as to have thicknesses greater than those of the wiring patterns adjacent to the corresponding lands for mounting components. Therefore, the strength of the lands for mounting components is greater than the other wiring portions so that the module can tolerate stresses applied between the circuit components and the lands for mounting components, which results in a module having high connection reliability.

Preferably, the lands for mounting components have a double-layer structure defined by an upper layer portion connected to the circuit components and a lower layer portion which is continuous with the wiring patterns. The upper layer portion is embedded in the resin layer. The lower layer portion is formed on the first main surface of the resin layer.

Since the upper layer portion of the lands connected to the circuit components is embedded in the resin layer, the lands and the resin layer are firmly attached to each other, and stresses applied between the circuit components and the lands may be applied to the resin layer. Furthermore, since the lower layer portion of the lands is continuous with the wiring portions, the conductive states of the lands and the wiring portions are obtained with high reliability.

Preferably, the component incorporating module further includes via lands which are connected to the wiring patterns along the first main surface of the resin layer and which are formed so as to have thicknesses greater than those of the wiring patterns adjacent to the corresponding via lands, and conductive patterns which are conductively connected through the via lands and via holes and which are arranged on a second main surface of the resin layer so as to oppose the main first surface of the resin layer.

When the wiring patterns are arranged on the first main surface of the resin layer defining a board, the conductive patterns may be formed on the second surface of the resin layer and the conductive patterns and the wiring patterns may be connected to one another through the via holes. In such a case, the via holes and the via lands are conductively connected by forming the via lands along with the lands for mounting components. Accordingly, a component incorporating module having high reliability is obtained.

Preferably, the component incorporating module may further include at least an additional resin layer laminated on the first main surface of the resin layer, and terminal electrodes formed so as to be electrically connected to the circuit components on the back surface of the laminated lowermost resin layer. In this case, since the wiring patterns are covered with the additional resin layer, short circuits are not produced between the wiring patterns and other portions. Thus, when the component incorporating module is mounted on the circuit board, for example, surface mounting can be easily performed using the terminal electrodes.

As described above, according to the method for manufacturing a component incorporating module according to various preferred embodiments of the present invention, the circuit components are connected to the plurality of lands for mounting components independently formed on the transfer plate in an isolated manner. That is, since the lands are not connected to one another using wiring, the solder does not protrude out from the lands at a time of mounting using solder, for example. Therefore, the components are prevented from being moved and the solder is prevented from protruding. Accordingly, a component incorporating module having high connection reliability is obtained.

Furthermore, since a solder resist is not required, the depth and the height of the module can be reduced, the number of processing steps and the cost are reduced, and solder flashing is prevented from being produced.

In this component incorporating module, the lands for mounting components are formed so as to have thicknesses greater than those of the wiring patterns adjacent to the corresponding lands for mounting components. Therefore, the strength of the lands for mounting components is greater than the other wiring portions, and the strength of connections between the circuit components and the lands is improved. Accordingly, a module having high connection reliability is obtained.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described hereinafter with reference to accompanying drawings.

First Preferred Embodiment

Figure 1:
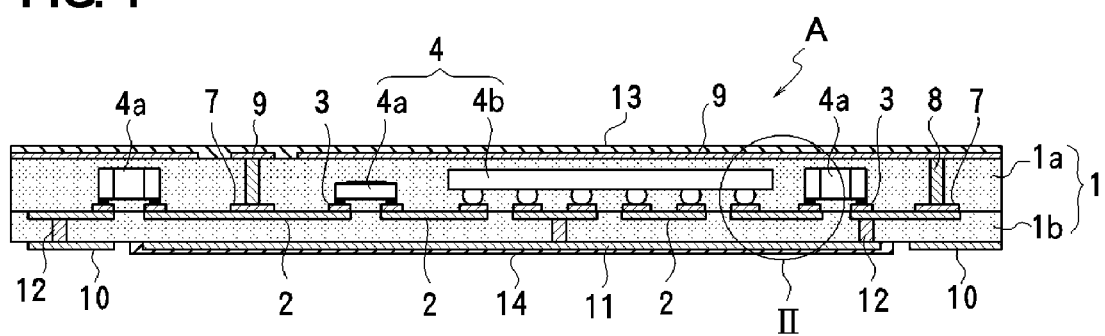
FIG. 1 is a sectional view illustrating a component incorporating module according to a first preferred embodiment of the present invention.
Figure 2A:
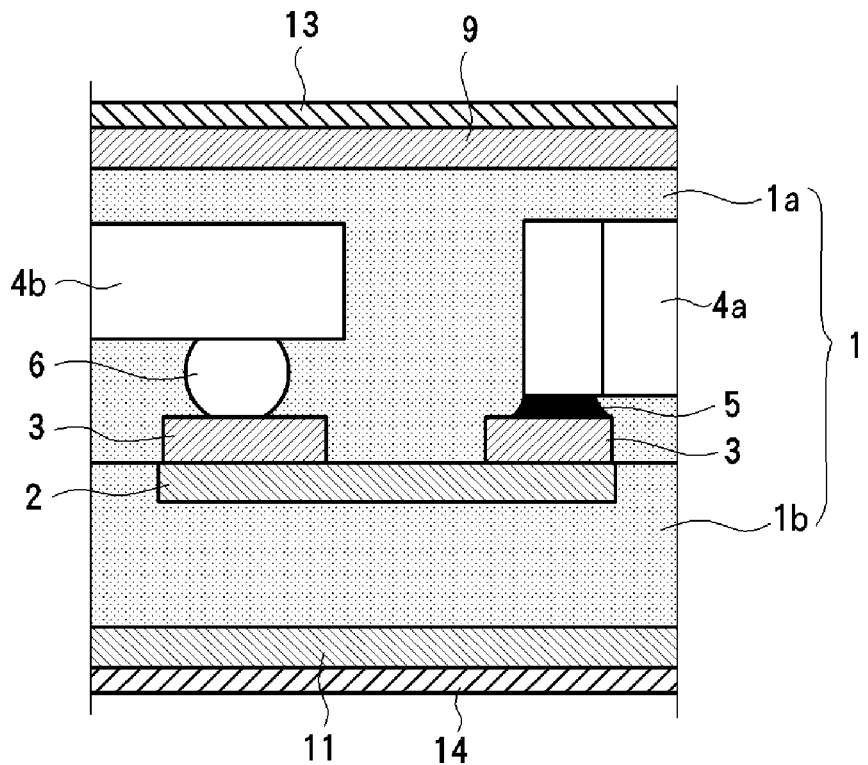
FIG. 2A is an enlarged view of a portion indicated by II shown in FIG. 1 when a normal solder paste is used.
Figure 2B:
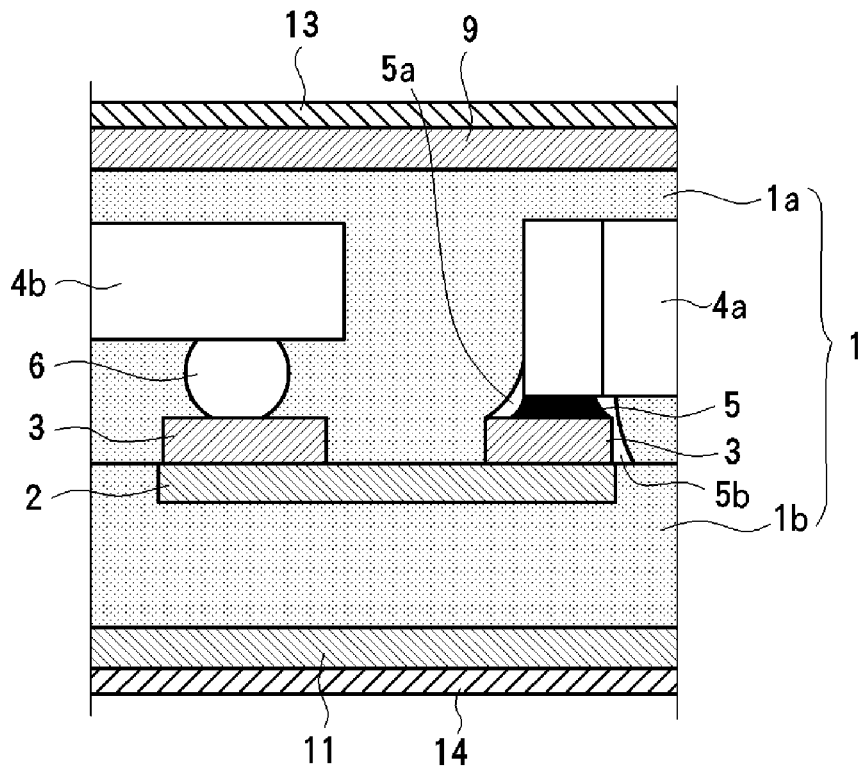
FIG. 2B is an enlarged view of the portion indicated by II shown in FIG. 1 when a solder paste including resin is used.

FIG. 1 and FIGS. 2A and 2B show a component incorporating module according to a first preferred embodiment of the present invention.

A module A includes a module board 1 which is made of a thermosetting resin and which has an electrical insulating property. The module board 1 has a double-layered structure defined by an upper resin layer 1a and a lower resin layer 1b.

In an inner side of the module board 1, that is, on a boundary surface between the upper resin layer 1a and the lower resin layer 1b, a plurality of lands 3 for mounting components and wiring patterns 2 which connect the lands 3 to one another are arranged. The lands 3 overlap with the wiring patterns 2 so that portions in which the lands are arranged have double-layered structures. The lands 3 are embedded in the upper resin layer 1a and the wiring patterns 2 are embedded in the lower resin layer 1b.

Circuit components 4 are arranged on the lands 3 using solder 5 and 6. The circuit components 4 have chip components 4a which may preferably include chip capacitors, chip inductors, and chip resistors, and multiterminal semiconductor devices (IC) 4b, such as power amplifier transistors. Note that solder resists are not interposed between the lands 3 and the wiring patterns 2 and between the upper resin layer 1a and the lower resin layer 1b. In this example, as shown in FIG. 2A, the chip components 4a are mounted on the lands 3 using the solder 5 in a surface mounted arrangement, and the semiconductor devices 4b are mounted on the lands 3 using the solder 6 in a flip-chip mounted arrangement.

In addition to the lands 3 for mounting components, via lands 7 are arranged on the boundary surface between the upper resin layer 1a and the lower resin layer 1b The via lands 7 are also connected to the lands 3 for mounting components through the wiring patterns 2. The via lands 7 are connected to via lands or conductive patterns 9 arranged on an upper surface of the upper resin layer 1a through via holes 8 penetrating through the upper resin layer 1a in a thickness direction. Note that the via lands 7 may be eliminated, and the wiring patterns 2 may be connected to the conductive patterns 9 through the via holes 8.

A plurality of terminal electrodes 10 and a ground electrode 11 having a large area are arranged on a lower surface of the lower resin layer 1b The ground electrode 11 functions as a shield electrode. The terminal electrodes 10 and the ground electrode 11 are connected to the wiring patterns 2 through via holes 12 penetrating through the lower resin layer 1b in a thickness direction.

The conductive patterns 9 and the ground electrode 11 are covered with resist films 13 and 14, respectively. Note that the resist film 13 covering the conductive patterns 9 may be entirely or partially removed so that another circuit component can be mounted on the conductive patterns 9.

The lower resin layer 1b functions as a mounting surface which is provided on a circuit board (mother board). Since the lower resin layer 1b may be exposed to a high temperature when the module A is mounted on the circuit board, the lower resin layer 1b preferably does not include the circuit components 4 therein.

As described above, since the plurality of circuit components 4 are incorporated in the module board 1, miniaturization and high density of the module A are achieved. In particular, since the lower resin layer 1b is laminated on a lower surface of the upper resin layer 1a in which the circuit components 4 are embedded and the terminal electrodes 10 are arranged on the lower surface of the lower resin layer 1b, the module A is mounted on the circuit board (mother board) through the terminal electrodes 10. Since the wiring patterns 2 are not exposed on the mounting surface after mounting, the wiring patterns 2 are prevented from being short-circuited with portions of the circuit board having different potentials. Accordingly, the module A having a high reliability is obtained.

An example of a method for manufacturing the module A having the configuration described above will be described with reference to FIGS. 3A to 3F and FIGS. 4G to 4K.

Figure 3A:
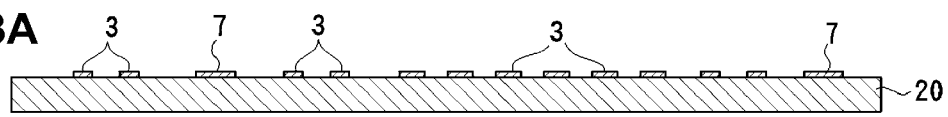
FIGS. 3A to 3F are process charts illustrating a first half of a manufacturing process of the component incorporating module shown in FIG. 1.

As shown in FIG. 3A, the plurality of lands 3 for mounting components and the via lands 7 are arranged on a transfer plate 20 so as to be isolated from one another. That is, the lands 3 and the via lands 7 are not connected to one another through wiring portions. The transfer plate 20 may be a hard plate, such as a metal plate or a resin plate. Alternatively, the transfer plate 20 may be a mold release film. The lands 3 and the via lands 7 are formed such that a copper foil is laminated on the transfer plate 20 and the lands 3 and the via lands 7 are patterned by etching. Alternatively, the lands 3 and the via lands 7 which have been patterned may be directly formed on the transfer plate 20 by a known thick-film formation method or a known thin-film formation method.

Figure 3B:
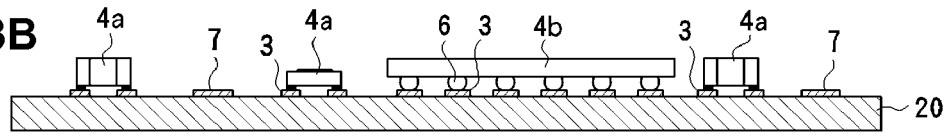

As shown FIG. 3B, the circuit components 4 (4a and 4b) are mounted on the lands 3 for mounting components arranged on the transfer plate 20. As a mounting method, for example, the chip components 4a are mounted on the lands 3 using the solder paste 5, the semiconductor devices 4b are mounted on the lands 3 using the solder bumps 6, and in this state, reflow processing is performed so that the solder paste 5 and the solder bumps 6 melt whereby the circuit components 4 are mounted on the lands 3. Note that methods other than the mounting method described above may be used. Since the lands 3 are formed on the transfer plate 20 so as to be isolated from one another (wiring portions connected to the lands 3 are not formed), the solder does not protrude to the wiring portions. Accordingly, the circuit components 4 are prevented from being moved from locations corresponding to the lands, and the solder is prevented from protruding from portions corresponding to the lands adjacent to the solder. Furthermore, a solder resist is not required to be provided.

Although any known solder pastes can be used as the solder paste 5, solder pastes including resin are preferable. The situation in which a solder paste including resin is used will be described hereinafter. When the solder paste including resin is used as the solder paste 5, solder particles are clumped together during a first reflow process so that resin included in flux flows out, and back surfaces of the chip components to be mounted and solder filet portions are coated with the resin. Accordingly, the solder is prevented from unnecessarily protruding to other portions at the during mounting using the solder. In addition, even when the solder melts during a second reflow process, solder flashing (deterioration due to a short circuit) is prevented from being produced. Furthermore, since the resin flows to the back surfaces of the chip components to be mounted, the board and the chip components are effectively attached to each other, that is, adhesion strength is increased. In FIG. 2B, a result of mounting using the solder paste including resin is shown. As with FIG. 2A, FIG. 2B is a sectional view, and a configuration shown in FIG. 2B is substantially the same as that shown in FIG. 2A, except that the solder paste including resin is used as the solder paste 5. Therefore, components common to those shown in FIG. 2A are denoted by the same reference numerals as those used in FIG. 2A and the descriptions thereof are omitted. Reference numerals 5a and 5b are resins flowing out the solder paste 5 when the solder paste 5 melts. The resins 5a and 5b coat filet portions of the solder paste 5 which has melted. Furthermore, the resin 5b is used to attach the back surfaces of the chip components 4a to the lower resin layer 1b As a solder paste including resin, a solder paste including epoxy resin which has a thermosetting property is typically used. However, solder pastes including resin having a thermal plasticity may also be used. Furthermore, a solder paste including resin may be similarly used for the solder bumps 6.

Figure 3C:
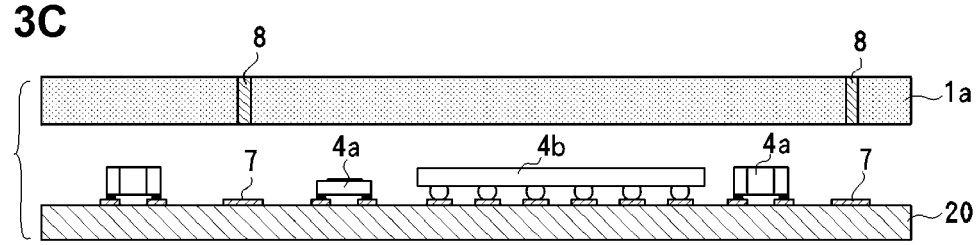

In FIG. 3C, the upper resin layer 1a is arranged on the transfer plate 20 including the lands 3 for mounting components and the circuit components 4 arranged on the lands 3. The upper resin layer 1a is a prepreg resin plate, and includes the via holes 8 in which the through hole thereof are filled with conductive paste and which are formed at locations corresponding to the via lands 7.

Figure 3D:
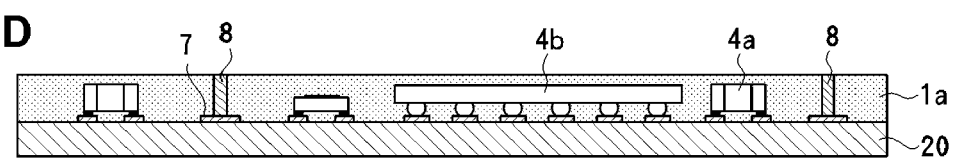

Then, as shown in FIG. 3D, the upper resin layer 1a is attached to the transfer plate 20 by pressure from above so that the circuit components 4, the lands 3, and the via lands 7 are embedded in the upper resin layer 1a Thereafter, the upper resin layer 1a is subjected to heat hardening. Since the upper resin layer 1a is hardened, the circuit components 4 are firmly fixed by the upper resin layer 1a and the lands 3 and the via lands 7 are also firmly fixed by the upper resin layer la. Simultaneously, the conductive paste filling the via holes 8 is hardened and attached to the via lands 7.

Figure 3E:
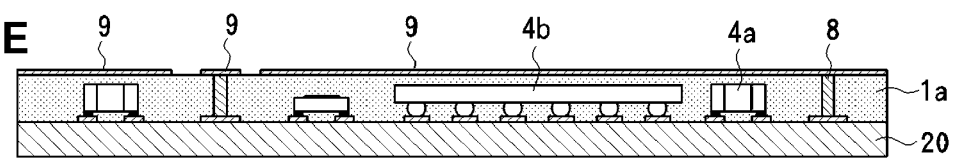

Next, as shown in FIG. 3E, the conductive patterns 9 are formed on the upper surface of the hardened upper resin layer 1a The conductive patterns 9 may be formed by the thick-film formation method for hardening the conductive paste by screen printing, or formed by the thin-film formation method, such as spattering or vapor deposition. When the conductive patterns 9 are formed, the via holes 8 and the conductive patterns 9 are electrically connected to each other.

Note that the via holes 8 formed by making holes in the upper resin layer 1a using a laser and being plated along with the conductive patterns 9 may be provided instead of the via holes 8 provided in the upper resin layer 1a in advance.

Figure 3F:
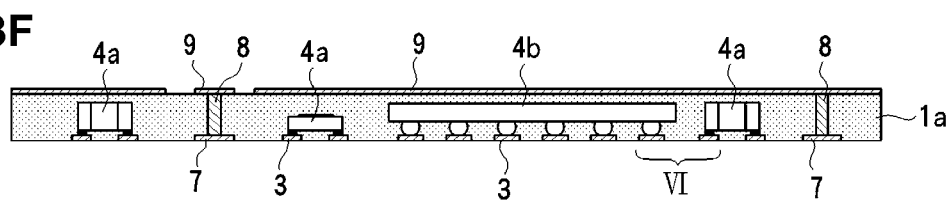

Then, as shown in FIG. 3F, the transfer plate 20 is removed from the lower surface of the hardened upper resin layer 1a, whereby the lands 3 and the via lands 7 are transferred to the upper resin layer 1a When the transfer plate 20 is formed of a mold release film, since the mold release film has a demolding property and flexibility, the transfer plate 20 is easily removed from the hardened upper resin layer 1a and the lands 3 and the via lands 7 are easily transferred.

Figure 4G:
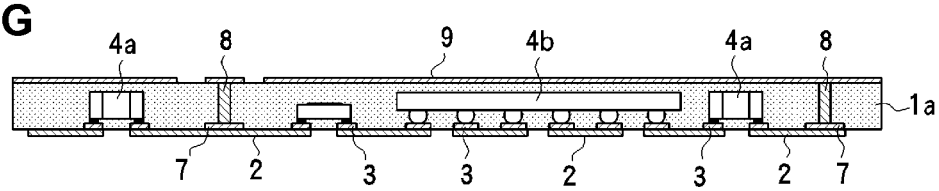
FIGS. 4G to 4K are process charts illustrating a second half of the manufacturing process of the component incorporating module shown in FIG. 1.

As shown in FIG. 4G, after the transfer plate 20 is removed, the wiring patterns 2 are formed on the lower surface of the upper resin layer 1a so as to overlap with back surfaces of the lands 3 and via lands 7. The wiring patterns 2 may be formed by the thick-film formation method for hardening the conductive paste by screen printing, formed by the thin-film formation method, such as sputtering or vapor deposition, or formed by plating. The lands 3 for mounting components and the via lands 7 independently arranged in the isolated manner are connected to one another through the wiring patterns 2. Since the wiring patterns 2 are arranged so as to overlap with the back surfaces of the lands 3 and the via lands 7, portions corresponding to the lands 3 and the via lands 7 have a double-layered structure, whereas other wiring portions have a single-layer structure.

Figure 4H:
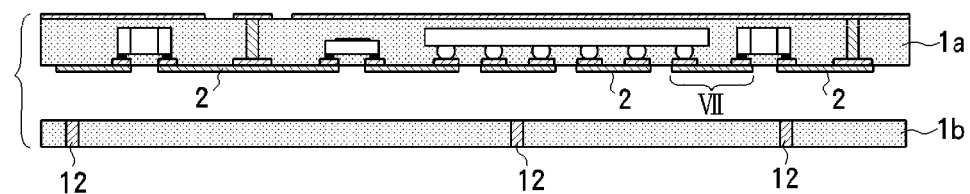

In FIG. 4H, the lower resin layer 1b is arranged below the upper resin layer 1a on which the wiring patterns 2 are arranged. The lower resin layer 1b is formed of a prepreg resin plate, and includes a plurality of via holes 12 in which through holes thereof are filled with conductive paste. The lower resin layer 1b is preferably formed of a resin that is identical to that of the upper resin layer 1a. However, the lower resin layer 1b may be formed of a different resin from that of the upper resin layer 1a.

Figure 4I:
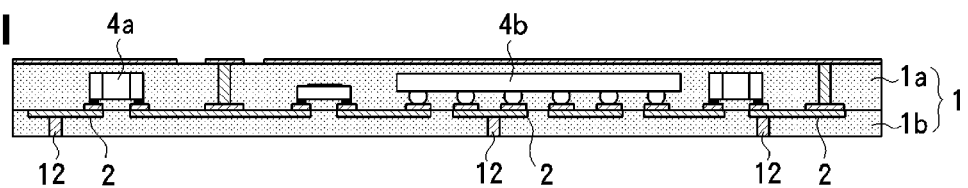

Then, as shown in FIG. 4I, the lower resin layer 1b is attached to the lower surface of the upper resin layer 1a by pressure so that the wiring patterns 2 are embedded in the lower resin layer 1b, and the lower resin layer 1b is subjected to heat hardening. Since the lower resin layer 1b is hardened, the upper resin layer 1a is firmly attached to the lower resin layer 1b, and simultaneously, the wiring patterns 2 are firmly attached to the lower resin layer 1b In addition, the conductive paste filling the via holes 12 is also hardened and attached to the wiring patterns 2.

Figure 4J:
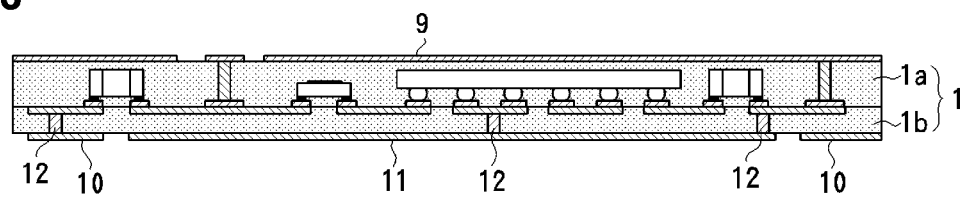

Then, as shown in FIG. 4J, the terminal electrodes 10 and the ground electrode 11 are formed on the lower surface of the lower resin layer 1b The terminal electrodes 10 are connected to the wiring patterns 2 through some of the via holes 12, and the ground electrode 11 is connected to the wiring patterns 2 through the other via holes 12.

Figure 4K:
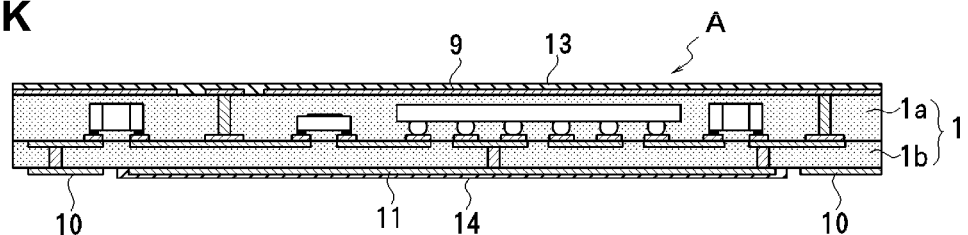

Finally, as shown in FIG. 4K, the resist film 13 and the resist film 14 are formed on the conductive patterns 9 arranged on the upper surface of the module board 1 and the ground electrode 11 arranged on the lower surface of the module board 1, respectively. The manufacturing of the module A is thus completed.

The method for manufacturing the single module A is described with reference to FIGS. 3A to 3F and FIGS. 4G to 4K. However, a method for manufacturing a mother module using mother resin layers 1a and 1b which are continuously arranged in a plane, and thereafter, dividing the module into separate modules obtains high productivity and uniform quality of the module.

Another method for manufacturing the component incorporating module A will be described with reference to FIGS. 6 and 7.

Figure 6:
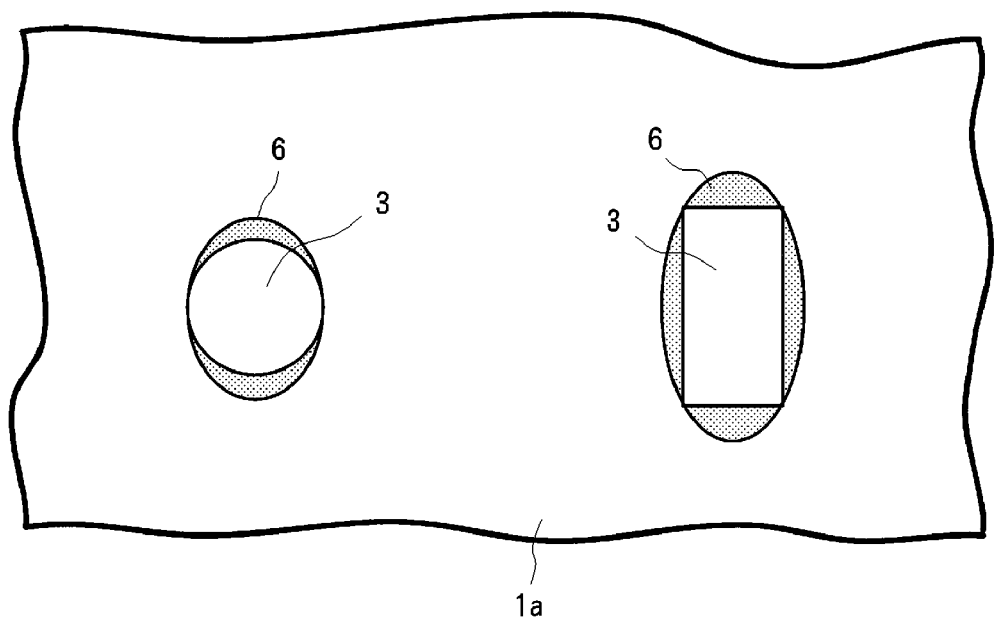
FIG. 6 is a partial enlarged view of a portion indicated by VI shown in FIG. 3F viewed from a lower side of a resin layer.
Figure 7:
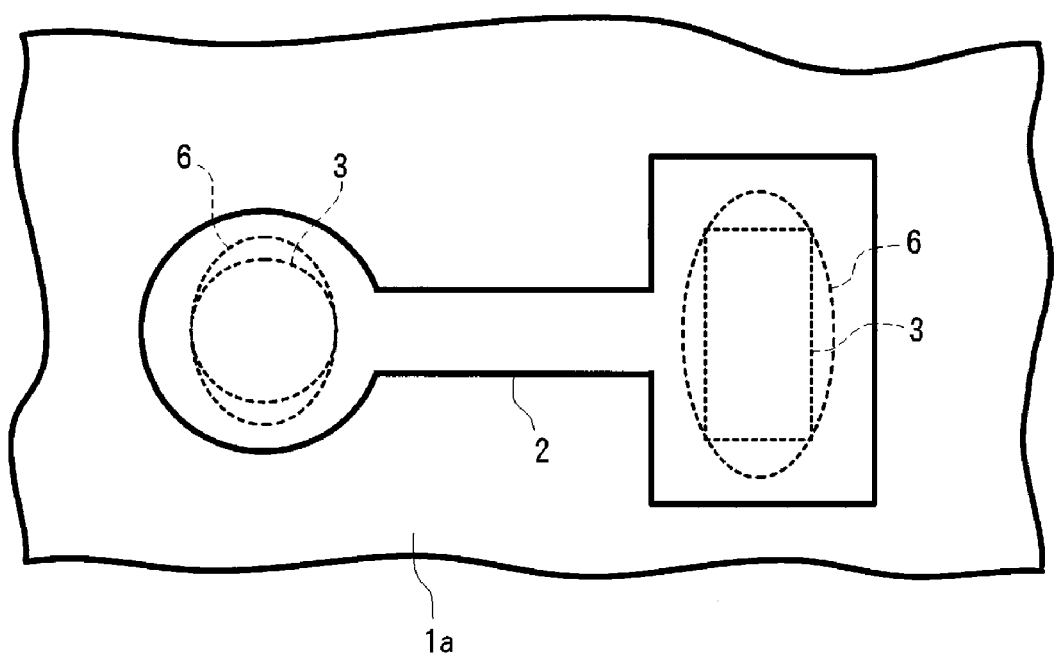
FIG. 7 is a partial enlarged view of a portion indicated by VII shown in FIG. 4H viewed from the lower side of the resin layer.

FIG. 6 is a diagram illustrating a portion indicated by VI in FIG. 3F viewed from the lower side of the upper resin layer 1a FIG. 7 is a diagram illustrating a portion indicated by VII in FIG. 4H viewed from the lower side of the upper resin layer 1a. As shown in FIG. 7, the wiring patterns 2 cover the lands 3 and are preferably larger than outer circumferences of the lands 3.

Where the solder 6 is arranged on the lands 3 when the circuit components 4 (4a and 4b) are mounted on the lands 3, the solder 6 may not fit within the lands 3 and may be exposed from the lower surface of the upper resin layer 1a as shown in FIG. 6. In this case, when the wiring patterns are formed as shown in FIG. 7, the solder 6 is covered with the wiring patterns 2. Therefore, since the solder 6 is not exposed to an etching solution used during etching that is performed when the terminal electrodes 10 and the ground electrode 11 are formed on the lower surface of the lower resin layer 1b by plating, the solder is prevented from protruding.

Second Preferred Embodiment

Figure 5:
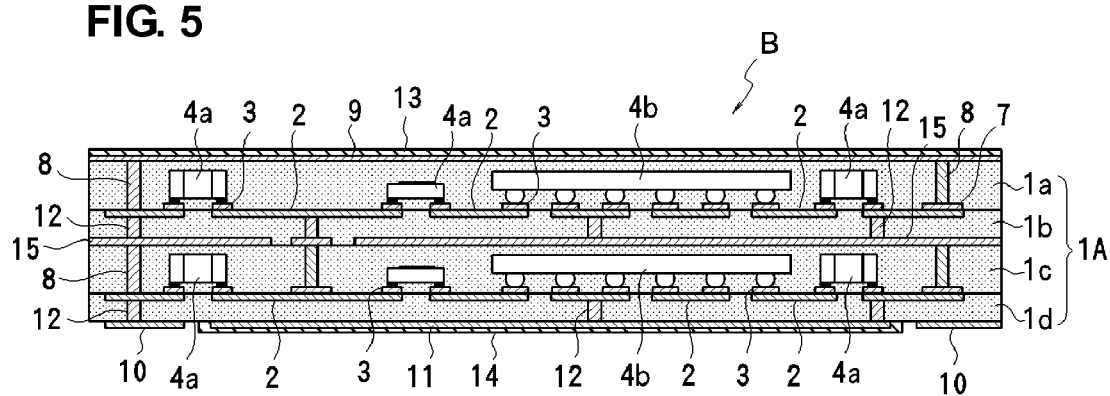
FIG. 5 is a sectional view illustrating a component incorporating module according to a second preferred embodiment of the present invention.

FIG. 5 is a diagram illustrating a component incorporating module according to a second preferred embodiment of the present invention. Note that the same reference numerals as shown in FIG. 1 are used in FIG. 5 so as to denote portions common to FIGS. 1 and 5, and descriptions thereof are omitted.

A module board 1A of a component incorporating module B includes four resin layers 1a to 1d laminated on one another in a vertical direction. Each of two pairs, that is, a pair of the first layer 1a and the second layer 1b and a pair of the third layer 1c and the fourth layer 1d, has the same structure as that of the module board 1 of the first preferred embodiment. Specifically, lands 3 for mounting components and via lands 7 are independently formed on a boundary surface between the first layer 1a and the second layer 1b, and wiring patterns 2 used to connect the lands 3 and the via lands 7 to one another are also formed on the boundary surface between the first layer 1a and the second layer 1b. Similarly, lands 3 for mounting components and via lands 7 are independently formed on a boundary surface between the third layer 1c and the fourth layer 1d, and wiring patterns 2 used to connect the lands 3 and the via lands 7 to one another are also formed on the boundary surface between the third layer 1c and the fourth layer 1d in an isolated manner.

Intermediate conductive patterns 15 are provided on a boundary surface between the second layer 1b and the third layer 1c. The intermediate conductive patterns 15 are connected to the wiring patterns 2 arranged between the first layer 1a and the second layer 1b through via holes 12, and furthermore, are connected to the via lands 7 or the wiring patterns 2 arranged between the third layer 1c and the fourth layer 1d through via holes 8. Accordingly, circuit components 4 and the wiring patterns 2 arranged in each of the layers are connected to terminal electrodes 10 and a ground electrode 11 formed on a bottom surface of the module board 1A through the via holes 8 and 12. The ground electrode 11 is covered with a resist film 14. A conductive pattern 9 connected to the inside of the module through the via holes 8 is arranged on an upper surface of the module board 1A and is covered with a resist film 13. Since the module board 1A is defined by the plurality of layers and the circuit components 4, and the wiring patterns 2 are embedded in the module board 1A as described above, high density and high functionality are further improved.

In the forgoing preferred embodiments, the circuit components 4 (4a and 4b) are attached to the lands 3 for mounting components by soldering or using solder bumps. However, in addition to the solder, conductive adhesive agents or metal bumps, such as gold bumps, may be used for the connection.

Furthermore, although active agents, such as the semiconductor devices 4b included in the circuit components 4 are preferably mounted in a flip-chip mounting manner using the solder bumps 6, the present invention is not limited to this and terminals may be attached to the lands 3 by soldering.

The component incorporating module including the module board having the double-layered structure according to the first preferred embodiment and the component incorporating module including the module board having the four-layered structure according to the second preferred embodiment are described. However, component incorporating modules having other layer structures may be provided. In such cases, a known multilayer substrate technique of forming conductive patterns between layers so as to form capacitors or forming resistors by printing may be used.

Although the second layer 1b, which is an intermediate layer, preferably does not include the circuit components 4 in the second preferred embodiment, the second layer 1b may include the circuit components 4.

Other features, elements, steps, characteristics and advantages of the present invention will become more apparent from the following detailed description of preferred embodiments of the present invention with reference to the attached drawings.

What is claimed is:

1. A component incorporating module comprising:
    an insulation resin layer;
    a plurality of lands arranged to mount circuit components and wiring patterns connected to the plurality of lands, which are arranged along a first main surface of the resin layer;
    circuit components arranged to be connected to the plurality of lands; and
    solder disposed between each of the plurality of lands and a respective one of the circuit components; wherein
    the circuit components are connected to the plurality of lands via the solder;
    the circuit components are embedded in the resin layer;
    the plurality of lands have thicknesses greater than those of the wiring patterns adjacent to the corresponding lands;
    the insulation resin layer is defined by a single insulation resin layer; and
    both of the plurality of lands and the circuit components are embedded in the single insulation resin layer.

2. The component incorporating module according to claim 1, wherein the plurality of lands have a double-layer structure defined by upper layer portions connected to the circuit components and lower layer portions which are continuous with the wiring patterns, the upper layer portions are embedded in the resin layer, and the lower layer portions are provided on the first main surface of the resin layer.

3. The component incorporating module according to claim 1, further comprising:
    via lands connected to the wiring patterns along the first main surface of the resin layer and arranged so as to have thicknesses greater than those of the wiring patterns adjacent to the corresponding via lands; and
    conductive patterns conductively connected through the via lands and via holes and arranged on a second main surface of the resin layer so as to oppose the main first surface of the resin layer.

4. The component incorporating module according to claim 1, further comprising:
    at least one additional resin layer laminated on the first main surface of the resin layer; and
    terminal electrodes arranged so as to be electrically connected to the circuit components on the back surface of the laminated lowermost resin layer.

* * * * *